United States Patent [19]

Mimura

[11] Patent Number: 4,468,259
[45] Date of Patent: Aug. 28, 1984

[54] UNIFORM WAFER HEATING BY CONTROLLING LIGHT SOURCE AND CIRCUMFERENTIAL HEATING OF WAFER

[75] Inventor: Yoshiki Mimura, Kanagawa, Japan

[73] Assignee: Ushio Denki Kabushiki Kaisha, Tokyo, Japan

[21] Appl. No.: 445,492

[22] Filed: Nov. 30, 1982

[30] Foreign Application Priority Data

Dec. 4, 1981 [JP] Japan ............................... 56-194576
Jun. 30, 1982 [JP] Japan ............................... 57-111500

[51] Int. Cl.³ .................. H01L 21/265; H01L 21/324
[52] U.S. Cl. .................................. 148/1.5; 29/576 T;
148/175; 148/187; 219/85 BA; 219/85 BM; 427/55
[58] Field of Search .................. 148/1.5, 187, 175; 29/576 T; 219/85 BA, 85 BM; 427/55

[56] References Cited

U.S. PATENT DOCUMENTS 3,627,590 12/1971 Mammel ............... 148/1.5
3,723,053 3/1973 Myers et al. ........... 148/1.5
4,016,006 4/1977 Yoshinaka et al. ..... 148/1.5
4,101,759 7/1978 Anthony et al. ....... 219/405
4,113,547 9/1978 Katz et al. ............ 148/175

FOREIGN PATENT DOCUMENTS 50427 3/1982 Japan ............... 29/576 T

Primary Examiner—Upendra Roy
Attorney, Agent, or Firm—Ziems, Walter & Shannon

[57] ABSTRACT

When heating a semiconductor wafer by means of application of radiated light, it is effective to employ subsidiary heating means whose temperature rises upon exposure to the radiated light so that the circumferential portion of the wafer is additionally heated to compensate radiation of heat therefrom. The subsidiary heating means is arranged to elongate along the circumference of the wafer. It is important to limit the ratio of the characteristics, whose definition will be given below, of the subsidiary heating means to that of the wafer to 0.6–1.4 in order to avoid the occurrence of such a damage as slip line or the like in the wafer. The characteristics are expressed by the following formula:

$$\frac{1-\eta}{\rho \cdot d \cdot C}$$

wherein
$\eta$: reflectivity;
$\rho$: specific gravity (g/cm³);
d: thickness (cm); and
C: specific heat (joule/g·°C.).

6 Claims, 4 Drawing Figures

UNIFORM WAFER HEATING BY CONTROLLING LIGHT SOURCE AND CIRCUMFERENTIAL HEATING OF WAFER

BACKGROUND OF THE INVENTION

1. Field of the Invention:

This invention relates to a method for heating a semiconductor wafer by means of application of radiated light.

2. Description of the Prior Art:

The ion implantation process has recently been finding actual utility as an effective method for introducing dopant atoms into a semiconductor wafer since it is possible to control accurately the concentration levels of dopant atoms and the depths of resulting junctions. In the ion implantation process, the dopant atoms are ionized and accelerated to high velocity and the wafer is bombarded with the dopant atoms. Whenever the ion implantation process is carried out, it is necessary to subject each resulting wafer to a subsequent heating treatment at about 1000° C. or higher in an inert gas such as argon so that the wafer is annealed to heal crystal defects which have been developed due to the implantation of ions. This heat treatment must be carried out in a short time period so as to prevent the concentration distribution of the implanted dopant atoms in the depthwise direction of the wafer from changing due to thermal diffusion. Furthermore, there is an outstanding demand for the establishment of a high-speed heating and cooling cycle for wafers in order to improve the productivity.

Reflecting the above-mentioned demands, a novel method has recently been developed to heat wafers by means of application of radiated light. According to this method, the temperatures of wafers may be raised to 1000° C.–1400° C. in a time period as short as a few seconds.

It has however been found that, when a wafer, for example, a wafer of single crystal of silicon is heated to 1000° C. or higher in a few seconds, a damage called "slip line" or bending is developed in the wafer because of a difference in the rising velocity of temperature between its circumferential portion and its central portion, in other words, due to a non-uniform temperature rise therebetween. The thickness of a wafer is generally very small, namely, of a level of about 0.5 mm or so and its thicknesswise temperature distribution is thus rendered substantially uniform in a very short time period of a level of $10^{-3}$ second or so. Accordingly, such a damage as slip line may be possibly avoided if the temperature distribution on the surface of each wafer is rendered uniform. However, it is very difficult to prevent the development of such a damage as slip line in actual process even if the surface of each wafer is exposed to radiated light having a uniform irradiation energy density, because more heat is to radiate off from the circumferential portion of the wafer than its central portion and the circumferential portion becomes cooler than the central portion.

SUMMARY OF THE INVENTION

With the foregoing in view, the present invention has as its object the provision of a heating method of a semiconductor wafer by means of application of radiated light without developing such a damage as slip line or the like.

In one aspect of this invention, there is thus provided a method for heating a semiconductor wafer by means of application of light radiated from a light source while additionally or assistantly heating the circumferential portion of the semiconductor wafer by subsidiary heating means which per se is heated upon exposure to the radiated light and is arranged to elongate along the circumference of the semiconductor wafer, which method comprises limiting the ratio of the characteristics of the subsidiary heating means to that of the semiconductor wafer to 0.6–1.4, said characteristics being expressed by the following formula:

$$\frac{1-\eta}{\rho \cdot d \cdot C}$$

wherein $\eta$: reflectivity;

$\rho$: specific gravity (g/cm$^3$);

d: thickness (cm); and C: specific heat (joule/g·°C.).

The heating method of this invention is effective in improving the uniformity of the temperature distribution of a water surface, thereby successfully preventing the occurrence of such a damage as slip line or the like. Therefore, the present invention has brought about an extremely large value from the practical viewpoint.

The above and other objects, features and advantages of the present invention will become apparent from the following description and the appended claims, taken in conjunction with the accompanying drawings.

DETAILED DESCRIPTION OF THE INVENTION

Figure 1:
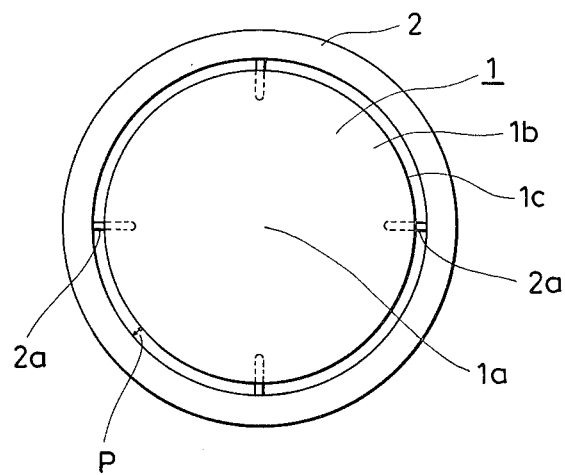
FIG. 1 is a top plan view of a wafer and subsidiary heating means placed in a light-irradiating furnace.

Referring now to the drawings, preferred embodiments of this invention will be described.

Figure 2:
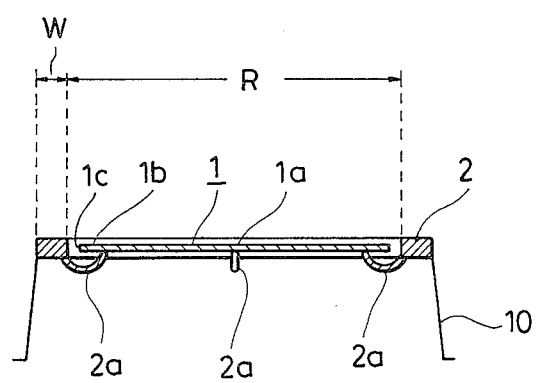
FIG. 2 is a cross-sectional front view of the wafer and subsidiary heating means.

Reference is first made to FIG. 1 and FIG. 2. Although not shown in the drawings, twelve (12) tubular halogen lamps, each of the power consumption of 1.5 KW, are arranged close to one another in a plane over and parallel to the upper surface of the semiconductor wafer 1 to be heat-treated thereby forming a plane light source, and another plane light source of the same arrangement of the lamps also provided underneath and parallel to the lower surface of the wafer 1 so that the wafer can be heated at both upper and lower surfaces thereof to about 1250° C. at central portions 1a of the upper and lower surfaces. The above plane light sources consume in total about 35 KW of electric power for the radiation of light. The wafer is one made of single crystal of silicon doped with boron in accordance with the ion implantation process. The wafer 1 has the thickness of 0.4 mm and the reflectivity $\eta$ of 0.3 to the light of wavelength of 10,000 Å.

Numeral 2 indicates a molybdenum ring which functions as the subsidiary heating means and which has the thickness of 0.6 mm, the width w of 10 mm, the inner diameter R of 11 cm and the reflectivity $\eta$ of 0.65 to the light of wavelength of 10,000 Å, for example. the molybdenum ring 2 is disposed surrounding the circumference 1c of the wafer 1. The ring is provided at several locations with hooks 2a supporting the wafer 1 thereon. Each of these hooks 2a is applied with a coating of silicon oxide (SiO$_2$). The clearance P between the wafer 1 and ring 2 is approximately 4 mm or so. Numeral 10 indicates supporting leg of the ring 2.

When the semiconductor wafer 1 is heated by means of application of light radiated from the plane light sources in the above arrangement, the central portion 1a of the wafer 1 is heated to about 1250° C. whereas the circumferential portion 1b reaches about 1180° C. Occurrence of a damage such as slip line or bending will not be observed. This means that the molybdenum ring 2 is also heated upon its exposure to the light radiated from the plane light sources and serves to additionally or assistantly heat the circumferential portion 1b of the wafer 1 so as to compensate a temperature drop at the circumferential portion 1b of the wafer 1 due to radiation of heat therefrom, thereby contributing to making the temperature of the wafer 1 uniform at the entire surface thereof. Unless the molybdenum ring 2 is provided, the temperature of the circumferential portion 1b will remain as low as about 1120° C. and development of clear slip lines will be recognized.

By the way, the characteristic feature of the heating method making use of radiated light resides, as described above, that the temperature of each wafer can be raised to a desired level in a short time period. Therefore, the subsidiary heating means is required to rise in temperature in a short time period in exactly or substantially the same way as the wafer when exposed to the radiated light and heated thereby.

The temperature-rising velocity $\Delta T/\Delta t$ of a material may be expressed, whether the material is a wafer or a molybdenum ring, by the following equation:

$$\rho \cdot d \cdot S \cdot C \cdot \frac{\Delta T}{\Delta t} = \phi \cdot (1 - \eta) \cdot S - x$$

wherein
- $\phi$: the energy density of light irradiated onto a surface perpendicular to the direction of the radiated light (W/cm$^2$);
- S: the area of the surface (cm$^2$);
- d: thickness (cm);
- $\rho$: specific gravity (g/cm$^3$); C: specific heat (joule/g·°C.);
- $\eta$: reflectivity
- x: heat loss due to radiation, conduction, convection, etc.

Since the value of x is small compared with the first variable $\phi$, the above equation may be rewritten approximately as:

$$\rho \cdot d \cdot S \cdot C \cdot \frac{\Delta T}{\Delta t} \simeq \phi \cdot (1 - \eta) \cdot S,$$

namely $\frac{\Delta T}{\Delta t} \simeq \phi \cdot \frac{1 - \eta}{\rho \cdot d \cdot C}$ It is preferred that the wafer and the molybdenum ring have substantially same value of $\Delta T/\Delta t$. Thus, using $$\frac{1 - \eta}{\rho \cdot d \cdot C}$$

as a designing standard for the subsidiary heating means and assuming the $$\frac{1 - \eta}{\rho \cdot d \cdot C}$$

of the molybdenum ring as $\alpha$ and that of the wafer as $\beta$, an investigation was carried out through a great deal of experiments as to possible relationship between the ratio $\alpha/\beta$ and development of a damage such a slip line due to non-uniform temperature distribution. As a result, it was uncovered that any $\alpha/\beta$ values smaller than 0.6 are too small to bring about the subsidiary heating effect to any sufficient extent, thereby failing to raise the temperature of the circumferential portion of the wafer sufficiently and causing a damage such as slip line to occur. On the other hand, it was also found that, when the ratio $\alpha/\beta$ should be greater than 1.4, the circumferential portion of the wafer becomes too high and a damage such as slip line is thus developed. Therefore, it is desirous to limit the ratio of the $$\frac{1 - \eta}{\rho \cdot d \cdot C}$$

of the molybdenum ring to that of the wafer to 0.6-1.4 so that their $\Delta T/\Delta t$ become substantially equal to each other. As reflectivity $\eta$, is employed a reflectivity of the light having the wavelength of 10,000 Å.

Another investigations were carried out in same manner as described above, while a tungsten ring or a tantalum ring was used in place of the molybdenum ring as the subsidiary heating means. As a result, it is recognized that so long as the above-defined ratio of a tungsten or a tantalum ring to the wafer is controlled within the range of 0.6-1.4, their temperature-rising velocity become close to each other similar to the results obtained in the above example. Thus, such a tungsten ring or a tantalum ring also serves effectively as the subsidiary heating means.

As has been understood from the above example, the object of this invention is to avoid the occurrence of such a damage as slip line or the like by additionally heating the circumferential portion of a wafer with subsidiary heating means, the temperature of which means rises upon exposure to radiated light, provided along the circumference of the wafer so as to compensate a temperature drop at the circumferential portion due to radiation of heat therefrom and thus minimizing the temperature difference between the central portion and circumferential portion of the wafer and making the temperature of the wafer uniform at the entire surface thereof.

Incidentally, the heating of wafers by means of radiated light is generally carried out in an atmosphere of an inert gas such as argon or in a vacuum.

Figure 3:
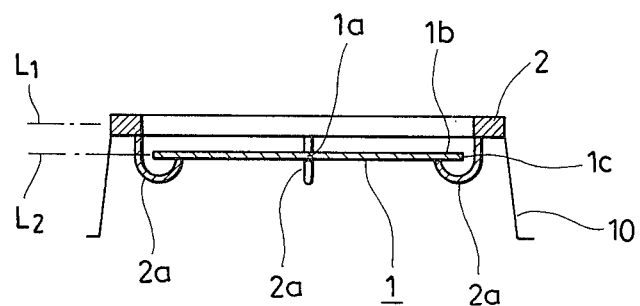
FIG. 3 is a cross-sectional fromt view of the another arrangement of th wafer and subsidiary heating means.

FIG. 3 shows another example of arrangement of wafer and subsidiary heating means. In this example, the ring 2 made of high fusing point metal such as molybdenum, tungsten or tantalum is arranged in a level L$_1$ slightly higher than the level L$_2$ in which the wafer 1 is positioned, and the circumferential portion 1b of the wafer 1 is heated by receiving heat from the ring 2 at its upper surface. Thus, the subsidiary heating means may be arranged in a different level from the wafer, while it is necessary to elongate along the circumference of the wafer in the neighborhood thereof.

Figure 4:
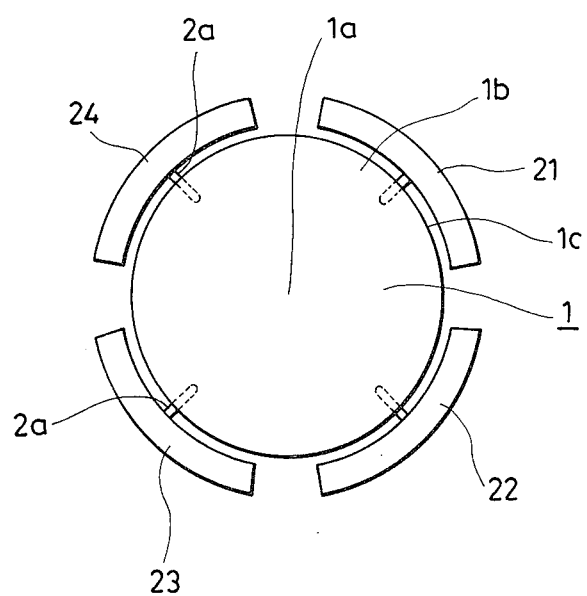
FIG. 4 shows another example of the subsidiary heating means.

In practice of the heating method according to this invention, the subsidiary heating means may comprise a plurality of elements such as pieces of a ring, for instance, as shown in FIG. 4, four arcuate plates 21, 22, 23 and 24 which are arranged in a circular line thereby forming a ring which elongates along the circumference of the wafer 1.

Having now fully described the invention, it will be apparent to one of ordinary skill in the art that many changes and modifications can be made thereto without departing from the spirit or scope of the invention as set forth herein.

What is claimed is:

1. A method for heating a semiconductor wafer by means of application of light radiated from a light source, the method comprising the steps of irradiating semiconductor wafer with a light radiated from the light source, including irradiating the circumferential portion of the semiconductor wafer, and additionally heating the circumferential portion of the semiconductor wafer with heat from a subsidiary heating means that extends along and adjacent to the circumference of the semiconductor wafer to thereby provide a uniform temperature across the surface of the wafer, the subsidiary heating means heated by the light energy from the light source, the ratio of a thermal characteristic of the subsidiary heating means to that of the semiconductor limited to a range between 0.6 and 1.4 said characteristics being expressed by the following formula:

$$\frac{1-\eta}{\rho \cdot d \cdot C}$$

wherein
 $\eta$: reflectivity;
 $\rho$: specific gravity (g/cm$^3$);
 d: thickness (cm); and
 C: specific heat (joule/g·°C.).

2. A method as claimed in claim 1, wherein the subsidiary heating means is a ring made of high fusing point metal.

3. A method as claimed in claim 2, wherein the subsidiary heating means has hooks which support the semiconductor wafer thereon.

4. A method as claimed in claim 1, wherein the light source comprises at least one plane light source the plane light source comprising a plurality of tubular halogen lamps arranged adjacent to one another in a plane parallel to the surface of the semiconductor wafer.

5. A method as claimed in claim 1, wherein the semiconductor wafer has been pretreated by the ion implantation process.

6. The method as claimed in claim 2, wherein the high fusing metal is selected from the group consisting of molybdenum, tungsten, or tantalum.

* * * * *